United States Patent [19]
Tomita et al.

[11] Patent Number: 6,078,242
[45] Date of Patent: Jun. 20, 2000

[54] LINE FILTER

[75] Inventors: Hiroshi Tomita, Hyogo; Toshinori Oda; Hirotaka Ishikawa, both of Osaka, all of Japan

[73] Assignee: Matsushita Electric Industrial Co., Ltd., Osaka, Japan

[21] Appl. No.: 09/340,243

[22] Filed: Jul. 1, 1999

[30] Foreign Application Priority Data

Jul. 1, 1998 [JP] Japan .................................. 10-185996
Dec. 25, 1998 [JP] Japan .................................. 10-369164

[51] Int. Cl.[7] .............................. H01F 27/30; H01F 27/24
[52] U.S. Cl. ........................... 336/212; 336/198; 336/208
[58] Field of Search ................................... 336/198, 208, 336/192, 212

[56] References Cited

U.S. PATENT DOCUMENTS 5,635,890  6/1997  Yamaguchi et al. ...................... 336/83
5,793,273  8/1998  Yamaguchi et al. ..................... 336/198
5,831,505  11/1998  Yamaguchi et al. ....................... 336/83
5,977,853  11/1999  Ooi et al. .................................. 336/65

Primary Examiner—Michael L. Gellner
Assistant Examiner—Anh Mai
Attorney, Agent, or Firm—Ratner & Prestia

[57] ABSTRACT

A line filter capable of eliminating the common mode noise and the normal mode noise altogether. It comprises both the common mode noise elimination means and the normal mode noise elimination means. A central magnetic core 32 is provided in the middle flange 34 of bobbin 23. A through-window 36 is provided at a place facing the counterpart feet 27 of closed magnetic circuit core 28 so as a part of the central magnetic core 32 is exposed, but the central magnetic core 32 and the closed magnetic circuit core 28 are not making contact with each other.

27 Claims, 17 Drawing Sheets

LINE FILTER

FIELD OF THE INVENTION

The present invention relates to a line filter that is capable of eliminating the common mode noise and the normal mode noise, for use in various domestic appliances.

BACKGROUND OF THE INVENTION

FIG. 29 is a perspective view of a conventional line filter. FIG. 30 is a cross sectional front view of the line filter. FIG. 31 is a chart of electric circuit used to describe transmission of a common mode noise in the line filter in operation. FIG. 32 is a chart of magnetic circuit used to describe flow of magnetic flux subject to a common mode noise in the line filter.

As shown in FIG. 29 and FIG. 30, a conventional line filter comprises a bobbin 72 having a through-hole 71, a first coil 73 and a second coil 74 wound around the bobbin 72, and a closed magnetic circuit core 75 which is inserted through the through-hole 71.

Referring to FIG. 31 and FIG. 32, in the means for eliminating common mode noise 76, magnetic flux AA and magnetic flux BB generated respectively from the first coil 73 and the second coil 74 proceed in a same direction in the magnetic core 75, in a manner they do not offset to each other.

Under the above described structure, when a common mode noise 76 is transmitted to an electric circuit as shown in FIG. 31, the magnetic flux AA and the magnetic flux BB proceed in the line filter along the directions as shown in FIG. 32.

Namely, the magnetic flux AA generated from the first coil 73 and the magnetic flux BB generated from the second coil 74 proceed in a same direction inside the magnetic core 75; joining together, in a manner not offsetting to each other.

Among the high frequency noise currents produced in an electric circuit through the commercial power supply are a common mode current and a differential mode current. The former current is called a common mode noise, the latter is called a normal mode noise.

A conventional line filter of the above structure is capable of eliminating the common mode noise 76, but it is unable to eliminate the normal mode noise.

SUMMARY OF THE INVENTION

The present invention is intended to offer a line filter that is capable of eliminating the common mode noise and the normal mode noise altogether.

A line filter in accordance with the present invention comprises a bobbin having a through-hole, a first coil and a second coil wound around the bobbin, a closed magnetic circuit core inserted through the through-hole of the bobbin, first noise elimination means for eliminating common mode noise, and second noise elimination means for eliminating normal mode noise. In the line filter, the first noise elimination means makes respective magnetic fluxes generated from the first coil and the second coil to proceed in a same direction in the magnetic core, in a mode not offsetting to each other, for the purpose of noise elimination. The second noise elimination means makes respective magnetic fluxes generated from the first coil and the second coil to proceed in opposite directions to each other, in a mode not offsetting to each other, for the purpose of noise elimination.

With the above structure, the first noise elimination means eliminates the common mode noise, while the second noise elimination means eliminates the normal mode noise. Thus the line filter eliminates both of the common mode noise and the normal mode noise altogether.

BRIEF DESCRIPTION OF THE DRAWINGS

FIG. 22 is a front view of the bobbin.

FIG. 23 is a cross sectional view of the bobbin.

DESCRIPTION OF THE PREFERRED EMBODIMENTS (Embodiment 1)

A line filter in accordance with a first exemplary embodiment of the present invention is described in the following with reference to the drawings.

Figure 1:
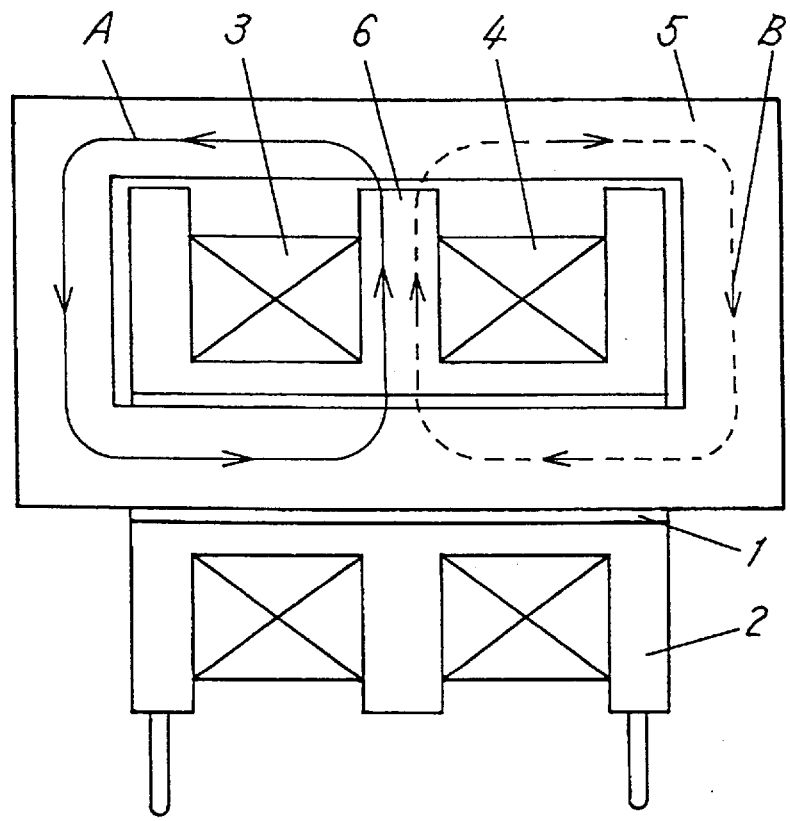
FIG. 1 illustrates a magnetic circuit of a line filter in accordance with a first exemplary embodiment of the present invention, showing flow of the magnetic flux due to normal mode noise.
Figure 2:
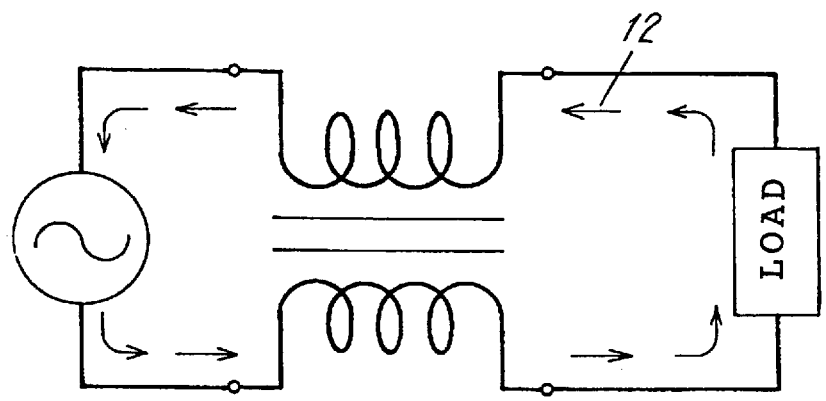
FIG. 2 is an electric circuit showing the transmission of normal mode noise when the line filter is used.
Figure 3:
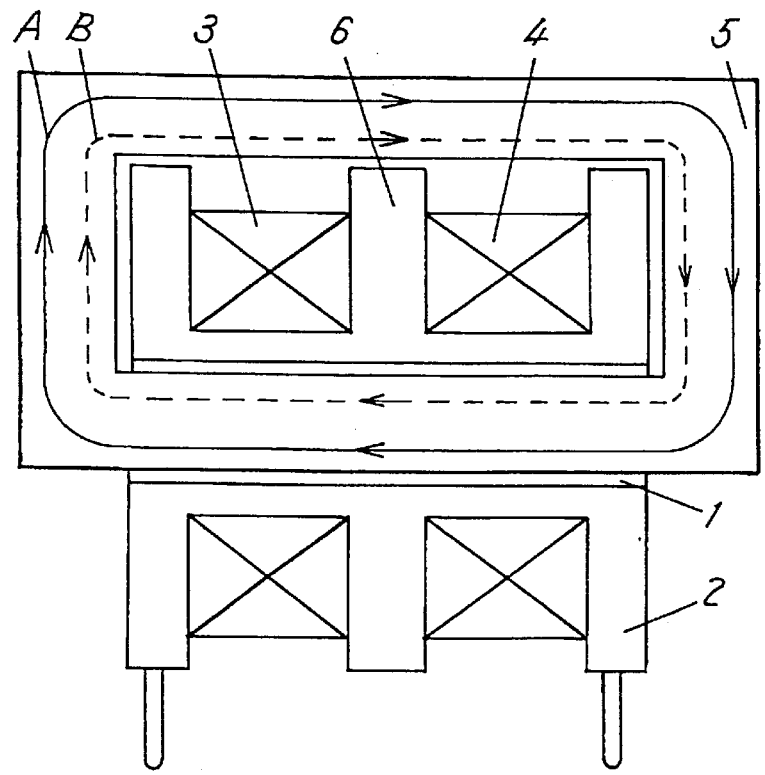
FIG. 3 illustrates a magnetic circuit showing flow of the magnetic flux due to common mode noise in the line filter.
Figure 4:
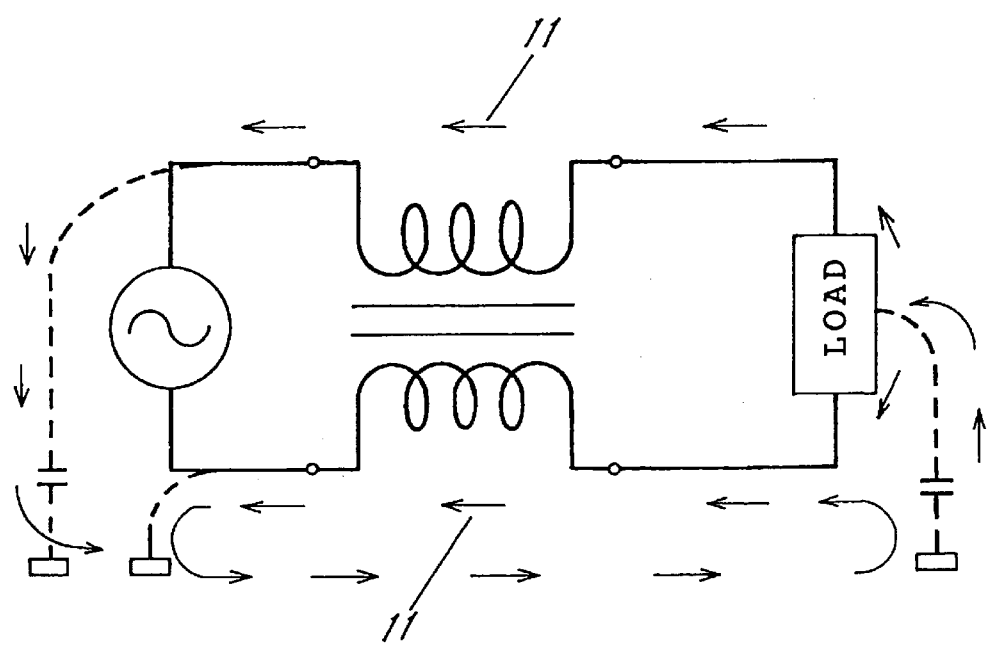
FIG. 4 is an electric circuit showing the transmission of common mode noise when the line filter is used.
Figure 5:
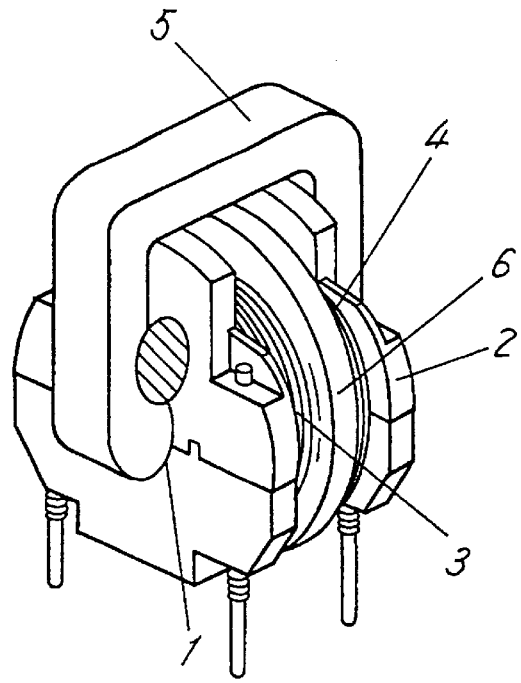
FIG. 5 is a perspective view of the line filter.
Figure 6:
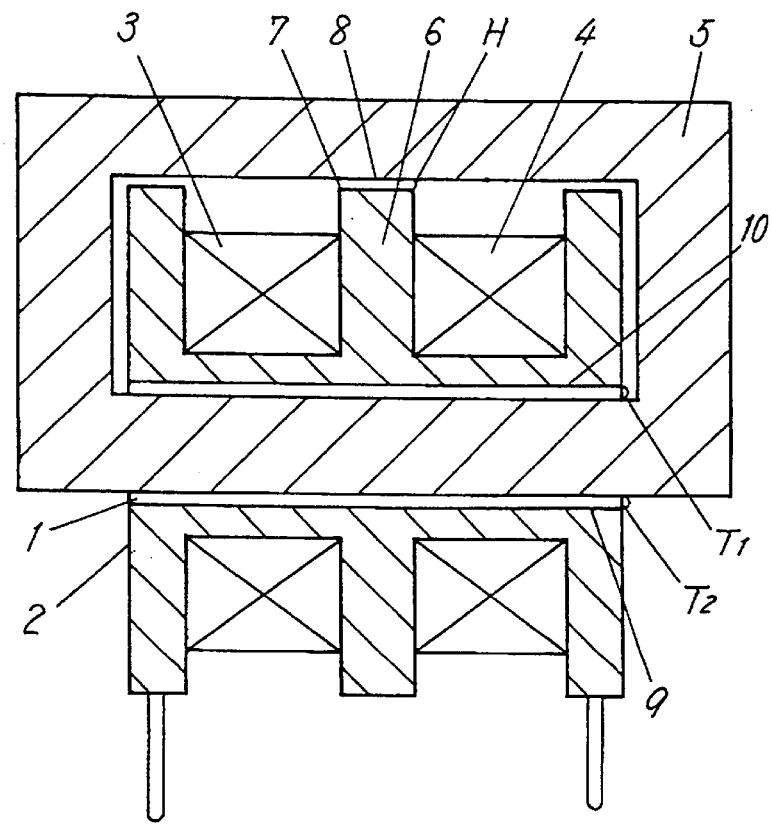
FIG. 6 is a cross sectional front view of the line filter.

As shown in FIG. 5 and FIG. 6, a line filter in accordance with a first exemplary embodiment of the present invention comprises a bobbin 2 having a through-hole 1, a first coil 3 and a second coil 4 wound around the bobbin 2 and a closed magnetic circuit core 5 having a rectangularly cylindrical shape inserted through the through-hole 1.

The bobbin 2 is provided with a middle flange 6 separating the first coil 3 from the second coil 4. The bobbin 2, inclusive of the middle flange 6, is made of a ferrite resin, which being a magnetic material.

As illustrated in FIG. 1 through FIG. 4, the line filter comprises first noise elimination means for eliminating a common mode noise 11, and second noise elimination means for eliminating a normal mode noise 12. The first noise elimination means makes respective magnetic flux A and magnetic flux B generated from the first coil 3 and the second coil 4 to proceed in a same direction in said magnetic core 5, in a mode not offsetting to each other, for the purpose of eliminating noise. The second noise elimination means makes respective magnetic flux A and magnetic flux B generated from the first coil 3 and the second coil 4 to proceed in opposite directions to each other in said magnetic core 5, in a mode not offsetting to each other; while the magnetic flux A and the magnetic flux B proceeding in a same direction within the middle flange 6, for the purpose of eliminating noise.

As shown in FIG. 6, the middle flange 6 is arranged adjacent to the magnetic core 5. Representing a distance between the bobbin and the magnetic core, viz. a distance of clearance between the outer circumferential surface 7 of the middle flange 6 and the inner wall-surface 8 of the magnetic core 5 at a place above the outer circumferential surface 7, with a symbol H; the smallest value of H is not greater than the gap dimensions T (T1+T2) between the inner wall-surface of the through-hole 1 of the bobbin 2 and the outer circumferential surface 10 of the magnetic core 5 being inserted in the through-hole 1, while the greatest value of H is not smaller than the gap dimensions T. Further, the outer circumferential surface 7 of the middle flange 6 of the bobbin 2 is not making contact with the inner wall-surface 8 of the magnetic core 5.

The operation of the above line filter is described in the following.

In the first noise elimination means, respective magnetic flux A and magnetic flux B generated from the first coil 3 and the second coil 4 proceed in a same direction in the closed magnetic circuit core 5, in a mode not offsetting to each other. The common mode noise 11 is eliminated in this way. In the second noise elimination means, respective magnetic flux A and magnetic flux B generated from the first coil 3 and the second coil 4 proceed in opposite directions to each other in the magnetic core 5, in a mode not offsetting to each other. The normal mode noise 12 is eliminated in this way. Thus, both of the common mode noise 11 and the normal mode noise 12 can be eliminated altogether.

Because the bobbin 2 is made of a magnetic material, at least in the middle flange 6, the magnetic flux A and the magnetic flux B generated from the first coil 3 and the second coil 4 readily proceed in the middle flange 6. When the magnetic flux A and the magnetic flux B are made to proceed in the magnetic core 5 in opposite directions to each other in a mode not offsetting to each other, the magnetic flux A and the magnetic flux B are naturally brought about to proceed in a same direction within the middle flange 6, and a magnetic flux A and a magnetic flux B is created around the first coil 3 and the second coil 4, respectively, to surely eliminate the normal mode noise 12.

Because the middle flange 6 of the bobbin 2 is arranged to be adjacent to the magnetic core 5, the magnetic flux A and the magnetic flux B proceed in the middle flange 6 quite easily, and, around the first coil 3 and the second coil 4, respectively, a magnetic flux A and a magnetic flux B are created. This further enhances the sure elimination of normal mode noise 12.

Furthermore, the distance H between bobbin and magnetic core is placed under a positional restriction, because the smallest value of H has been specified to be not greater than the gap dimension T (T1+T2), and the greatest value of H has been specified to be not smaller than the gap dimension T.

Namely, if the closed magnetic circuit core 5 is simply allowed to go through in the through-hole 1, the distance H between bobbin and magnetic core might become very great, or very far away to each other, subject to a value of the gap dimension T (T1+T2). In this case, it becomes difficult for the magnetic flux A and the magnetic flux B to proceed in the middle flange 6, and the effect of eliminating normal mode noise 12 may be ill affected. On the other hand, if the middle flange 6 comes in touch with the magnetic core 5, the magnetic saturation easily arises and the characteristics of superimposed current deteriorate, which provides an adverse influence on the elimination of both the normal mode noise 12 and the common mode noise 11. However, in the present embodiment, where the distance H between bobbin and magnetic core is subjected to a restriction, there will be no deterioration of the characteristics, and the adverse influence that could arise at the time of eliminating the normal mode noise 12 and the common mode noise 11 can be avoided.

Furthermore, because the smallest value of H, bobbin-magnetic core distance, has been specified to be greater than 0, the middle flange 6 and the magnetic core 5 never come in making contact to each other. Therefore, the adverse influence that could arise at the time of eliminating the normal mode noise 12 and the common mode noise 11 can be avoided with a higher sureness.

Figure 7:
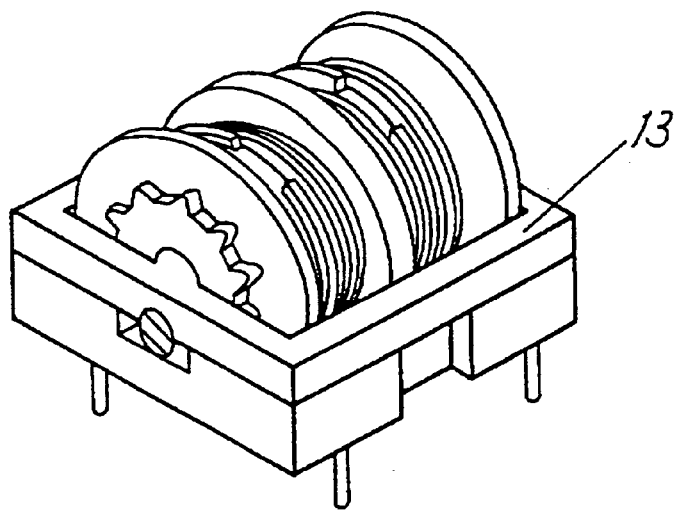
FIG. 7 is a perspective view of a line filter that employs a closed magnetic circuit core having an EI joining cross-sectional shape that the capital letters E and I are joined.
Figure 8:
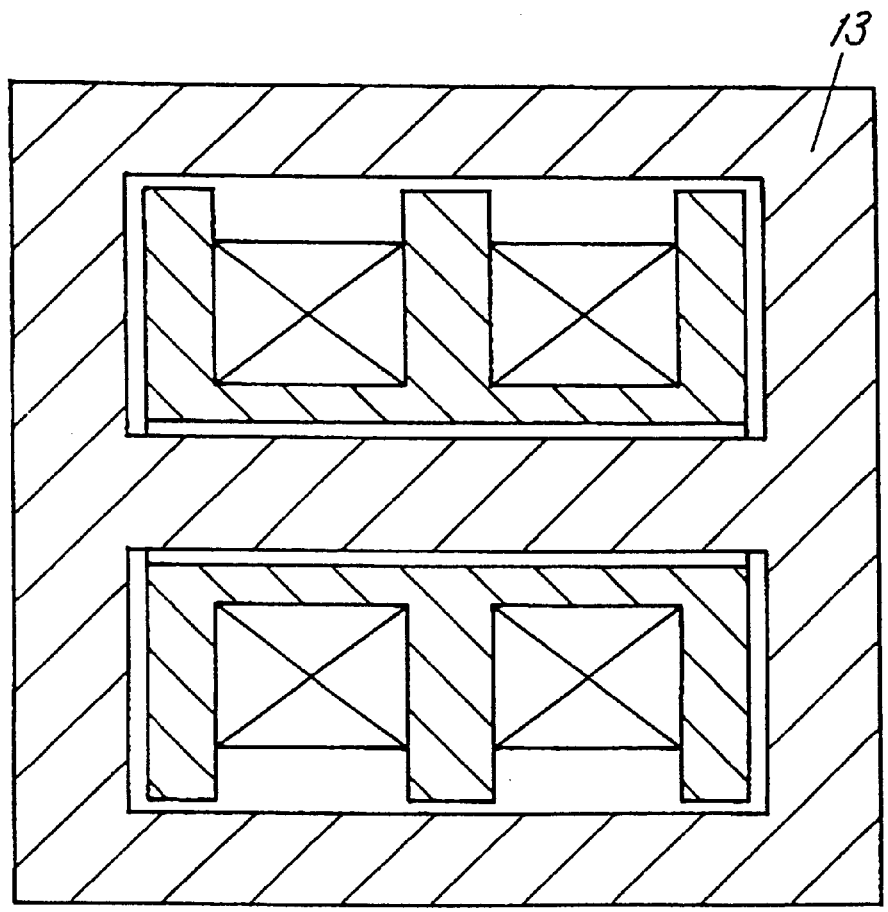
FIG. 8 is a cross sectional plan view of the line filter.

Although a line filter of the present exemplary embodiment 1 uses a closed magnetic circuit core 5 having a rectangularly cylindrical shape, a closed magnetic circuit core 13 having an EI joining cross-sectional shape as shown in FIG. 7 and FIG. 8 may be used instead for obtaining the same effects.

Figure 9:
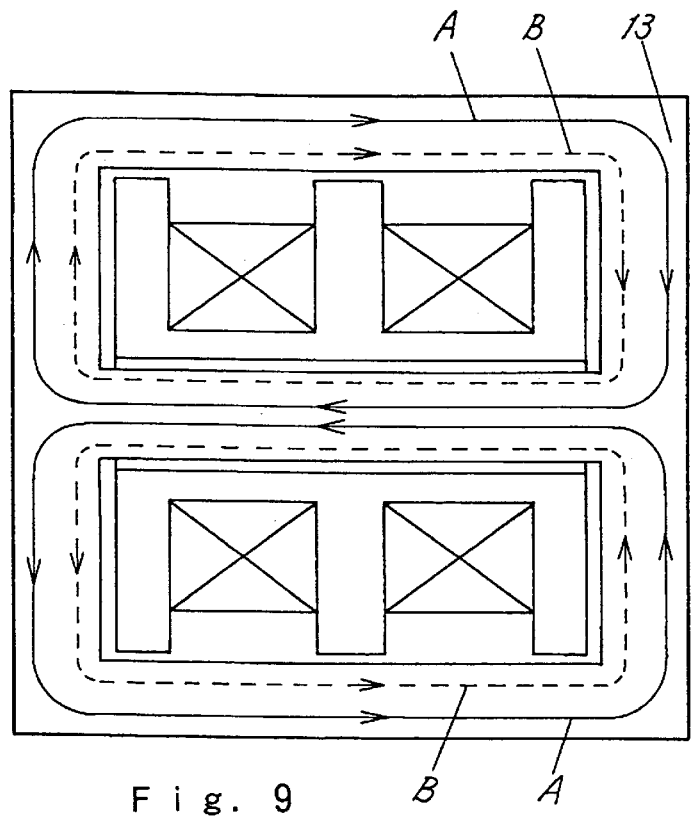
FIG. 9 illustrates a magnetic circuit in the line filter showing flow of the magnetic flux due to common mode noise.
Figure 10:
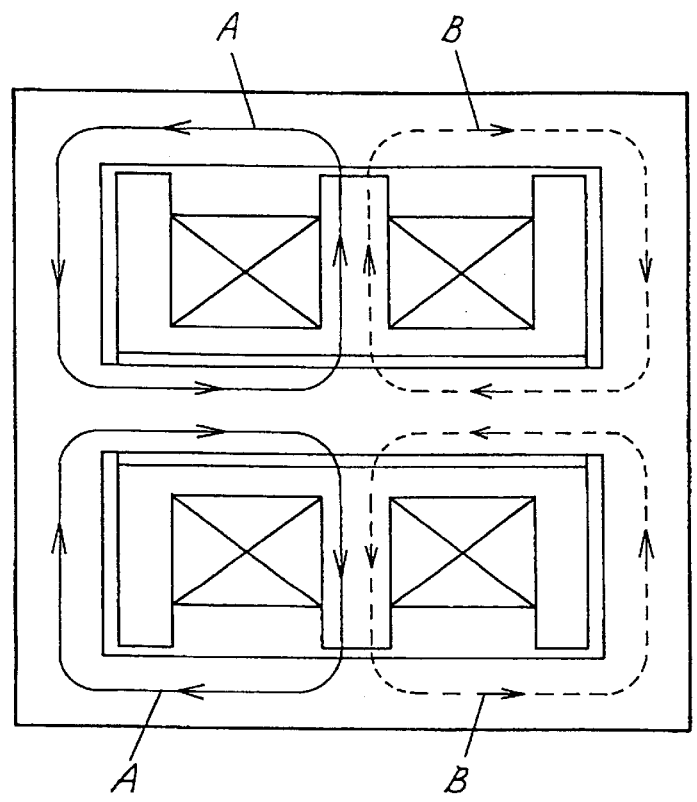
FIG. 10 illustrates a magnetic circuit in the line filter showing flow of the magnetic flux due to normal mode noise.
Figure 11:
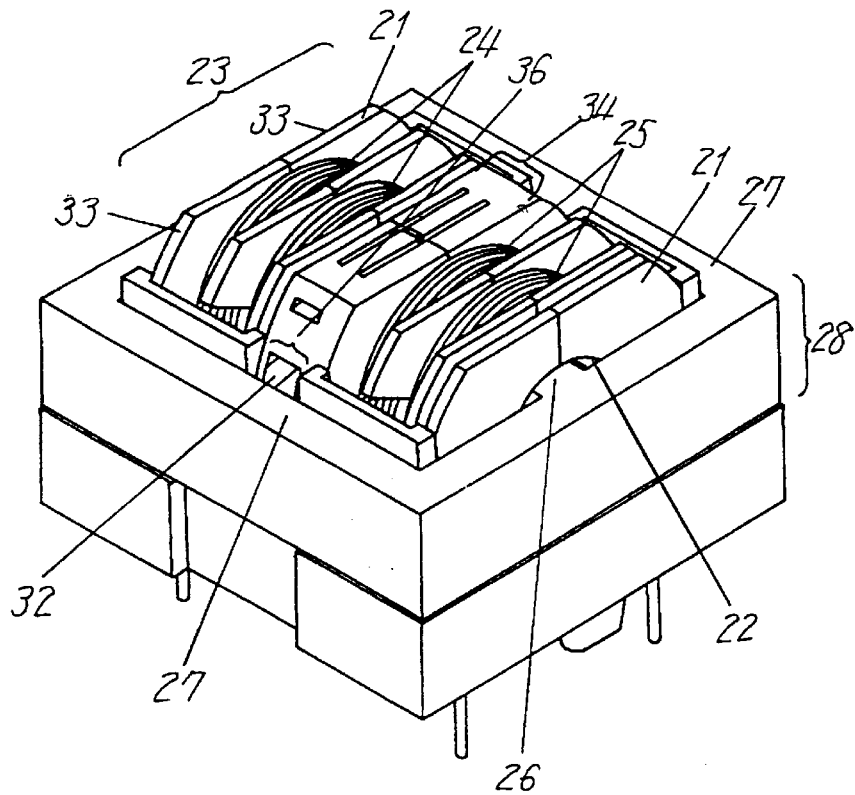
FIG. 11 is a perspective view of a line filter in accordance with a second exemplary embodiment of the present invention.
Figure 12:
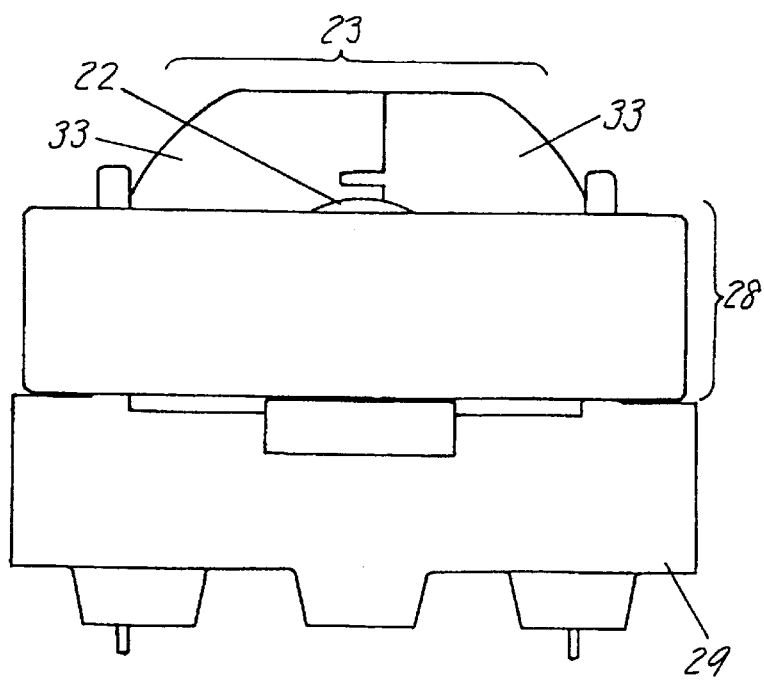
FIG. 12 is a side view of the line filter.

In the latter case, the magnetic flux A and the magnetic flux B due to common mode noise 11 proceed in a manner as illustrated in FIG. 9, while the magnetic flux A and the magnetic flux B due to normal mode noise 12 proceed in a manner as illustrated in FIG. 10.

(Embodiment 2)

A line filter in accordance with a second exemplary embodiment of the present invention is described in the following with reference to the drawings.

As illustrated in FIG. 11 through FIG. 17, the line filter comprises a bobbin 23 having a brim 21 at both ends and provided with a through-hole 22 between the brims 21, a first coil 24 and a second coil 25 wound around the bobbin 23, a closed magnetic circuit core 28 having a shape of the figure "8" composed of a middle foot 26 inserted in the through-hole 22 and counterpart feet 27 arranged outside the bobbin 23 encountering the middle foot 26, a terminal board 29 for holding the magnetic core 28 horizontal, first noise elimination means for eliminating the common mode noise 30 and second noise elimination means for eliminating the normal mode noise 31.

Figure 13:
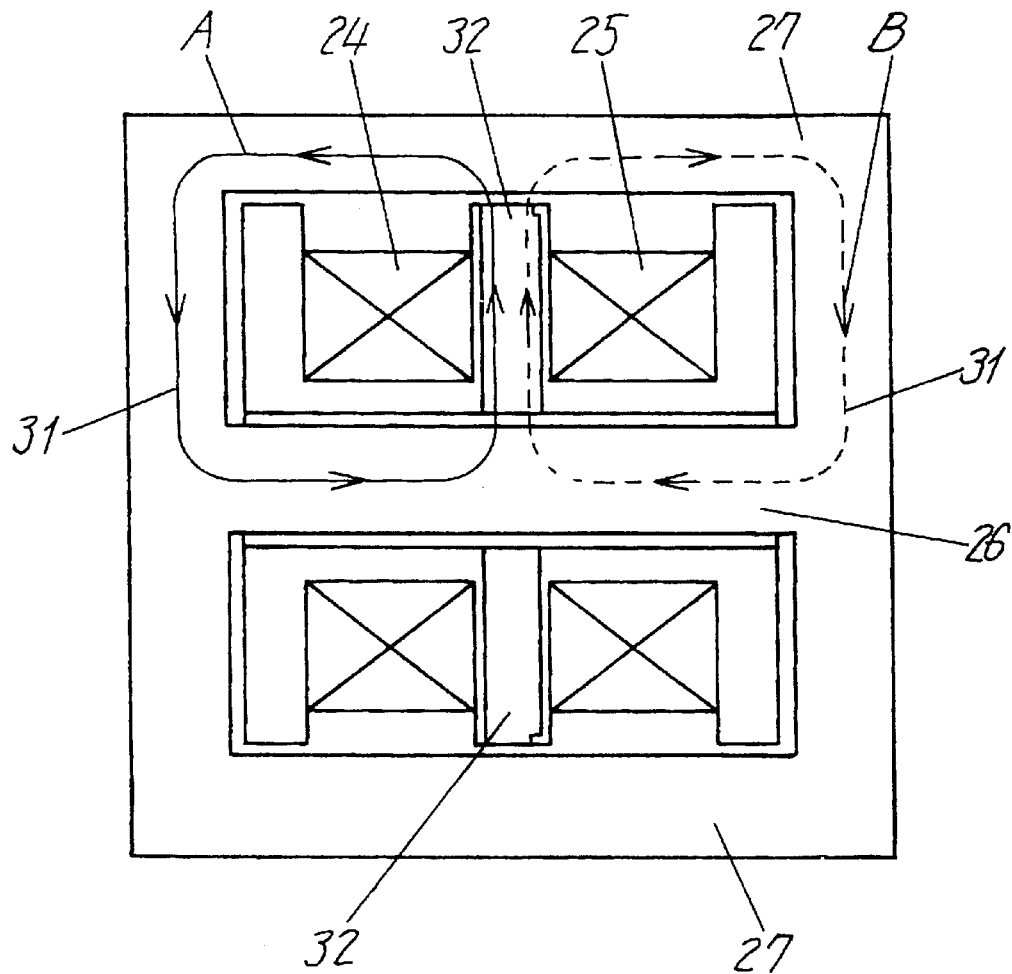
FIG. 13 illustrates a magnetic circuit in the line filter showing flow of the magnetic flux due to normal mode noise.
Figure 14:
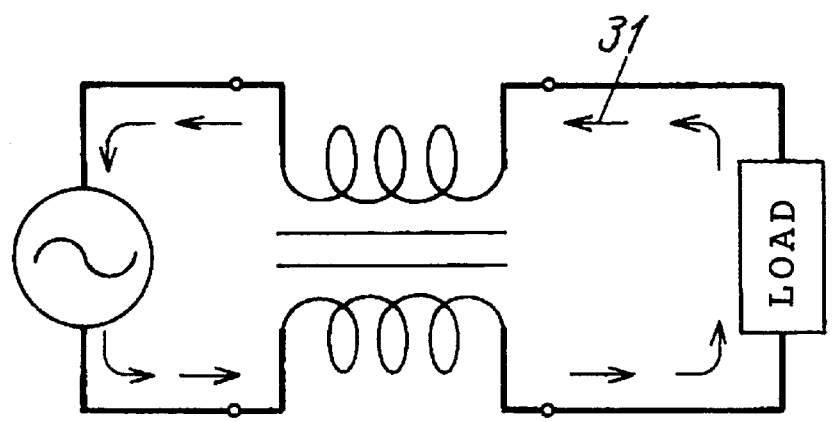
FIG. 14 is an electric circuit showing transmission of the normal mode noise when the line filter is used.
Figure 15:
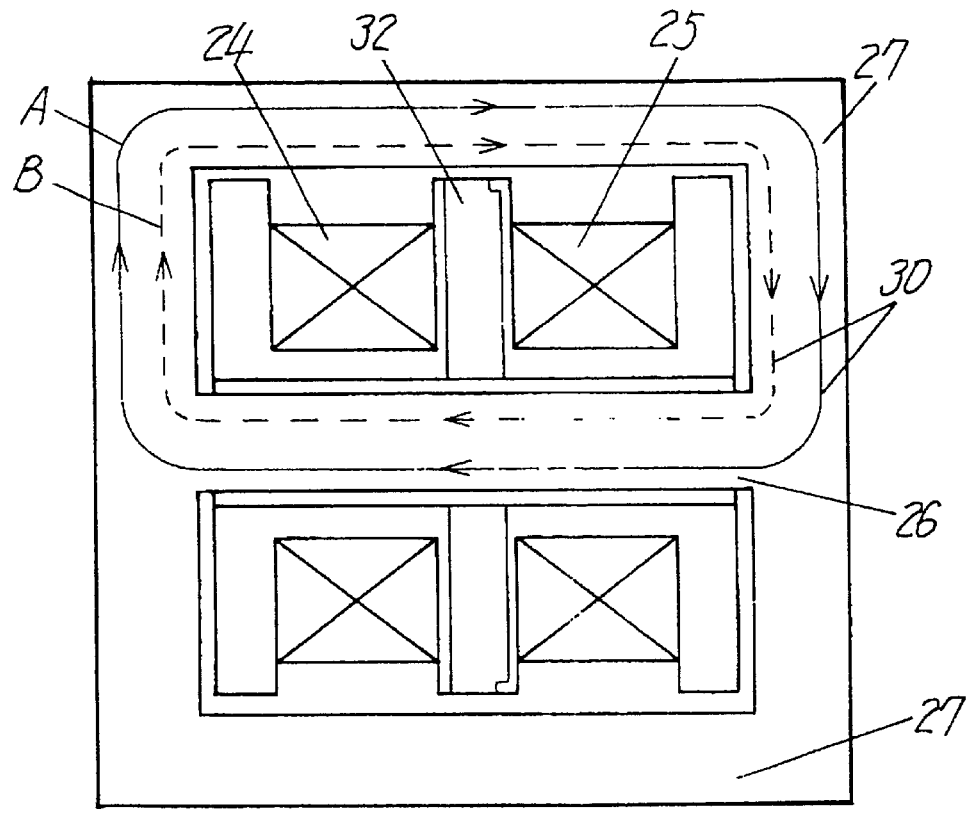
FIG. 15 illustrates a magnetic circuit of the line filter showing flow of the magnetic flux due to common mode noise.
Figure 16:
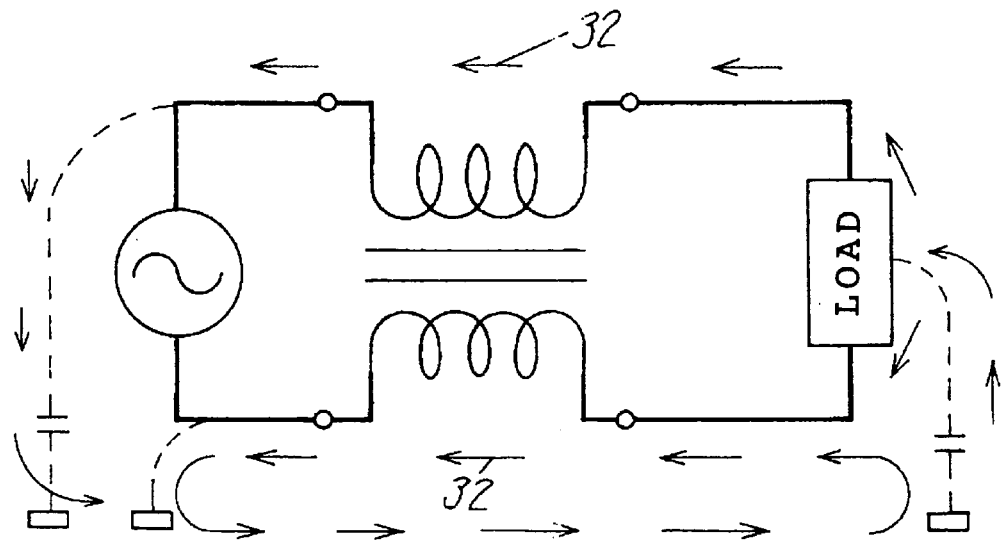
FIG. 16 is an electric circuit showing transmission of the common mode noise when the line filter is used.
Figure 17:
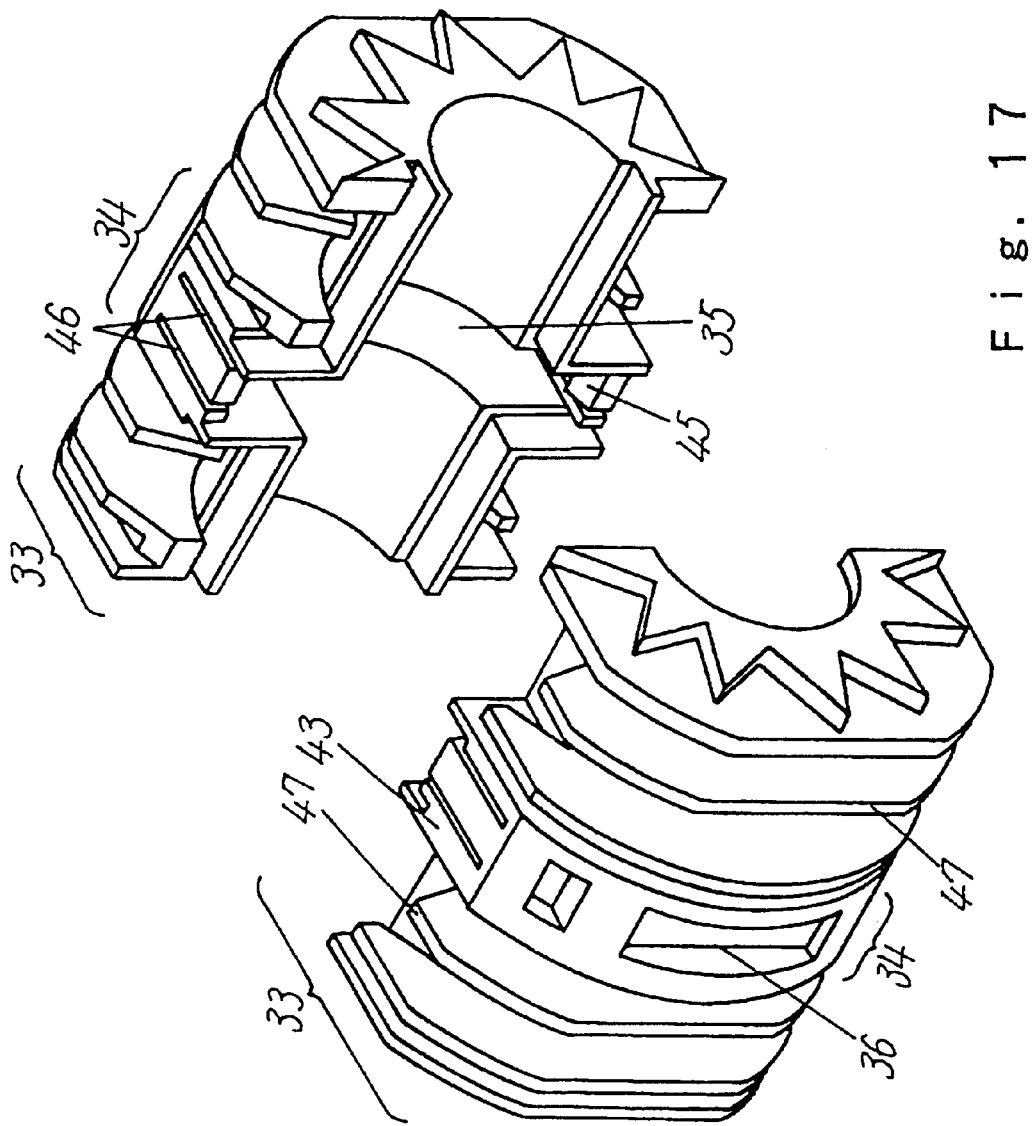
FIG. 17 is a perspective view showing two piece-members of a bobbin of the line filter.
Figure 18:
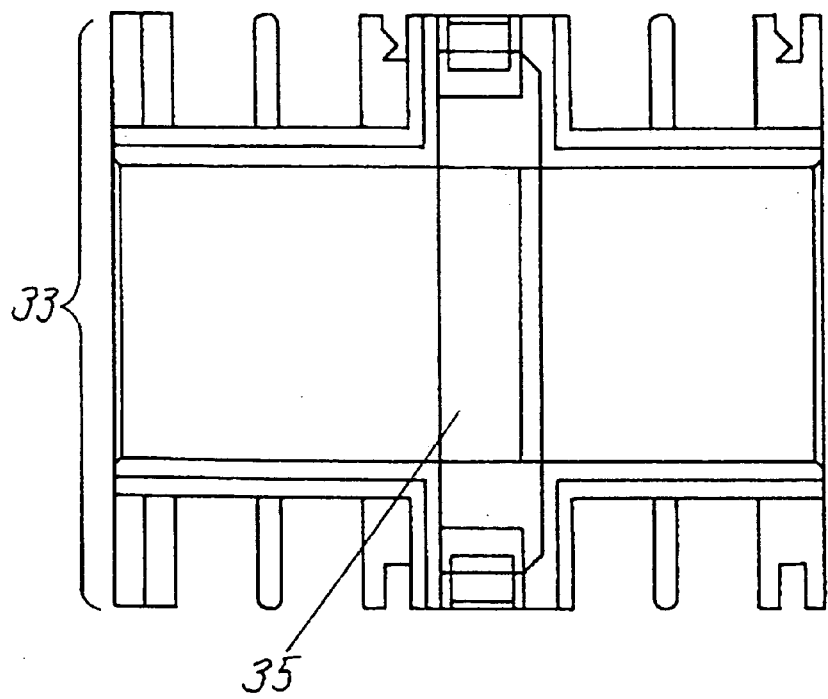
FIG. 18 is a rear view of the piece-member.
Figure 19:
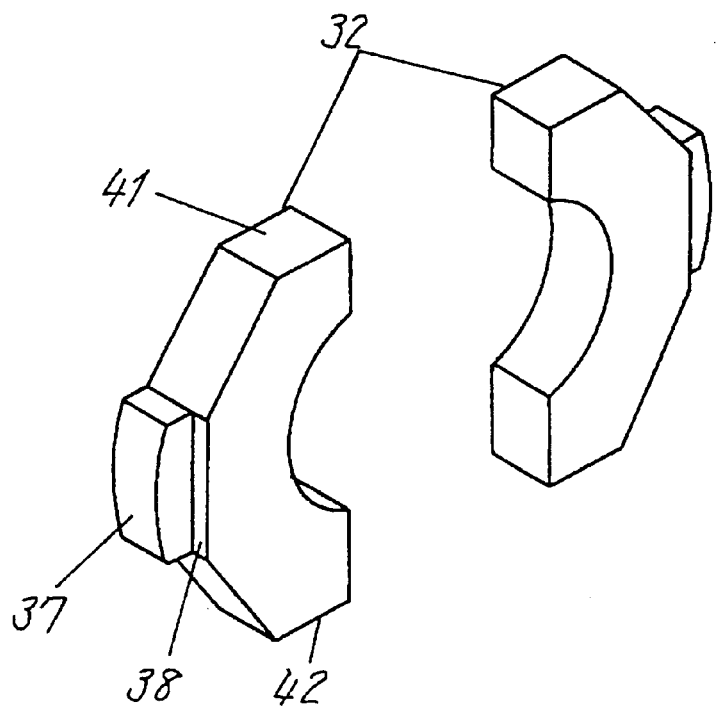
FIG. 19 is a perspective of a central magnetic core of the line filter.
Figure 20:
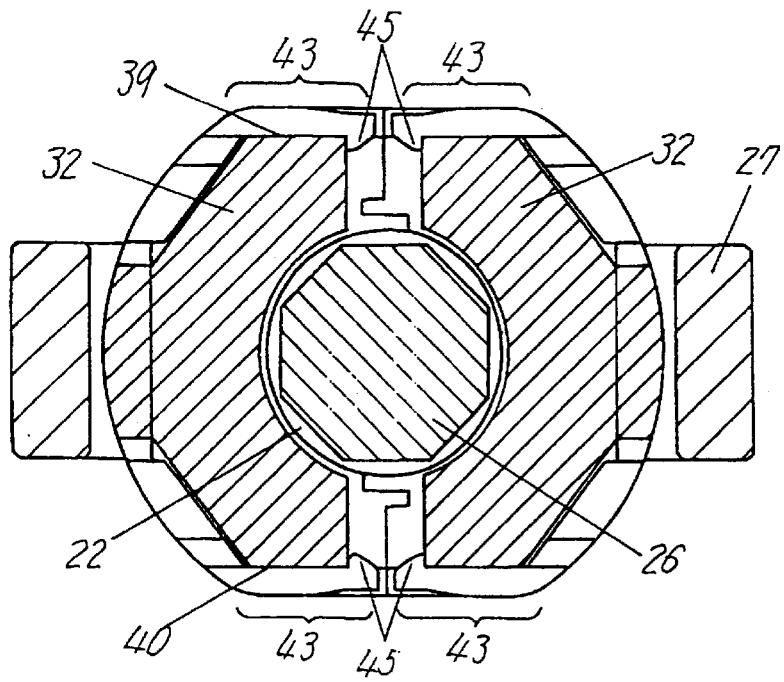
FIG. 20 is a cross sectional view of a bobbin with the central magnetic core inserted therein.
Figure 21:
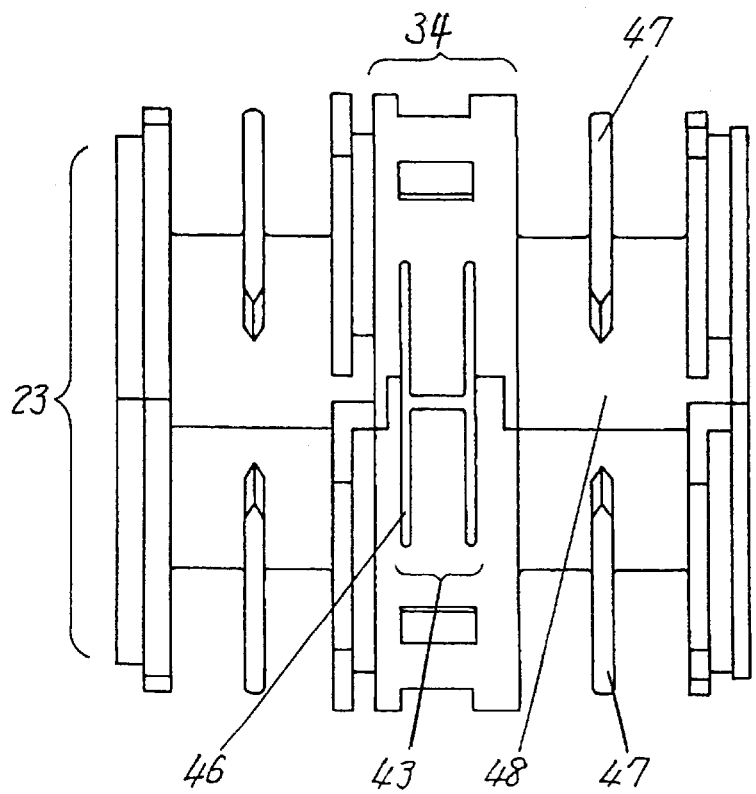
FIG. 21 shows a bobbin of the line filter as viewed from the top.
Figure 2:
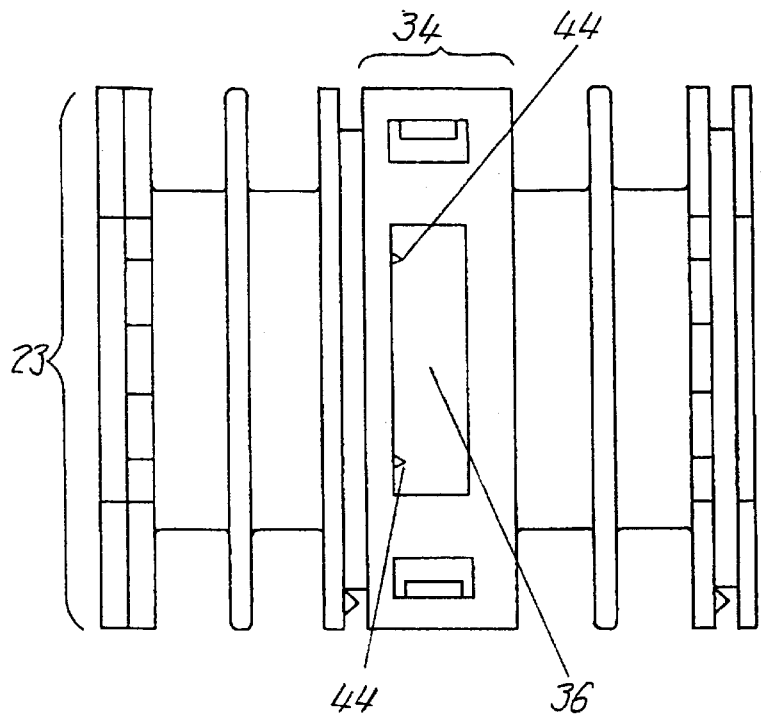
Figure 2:
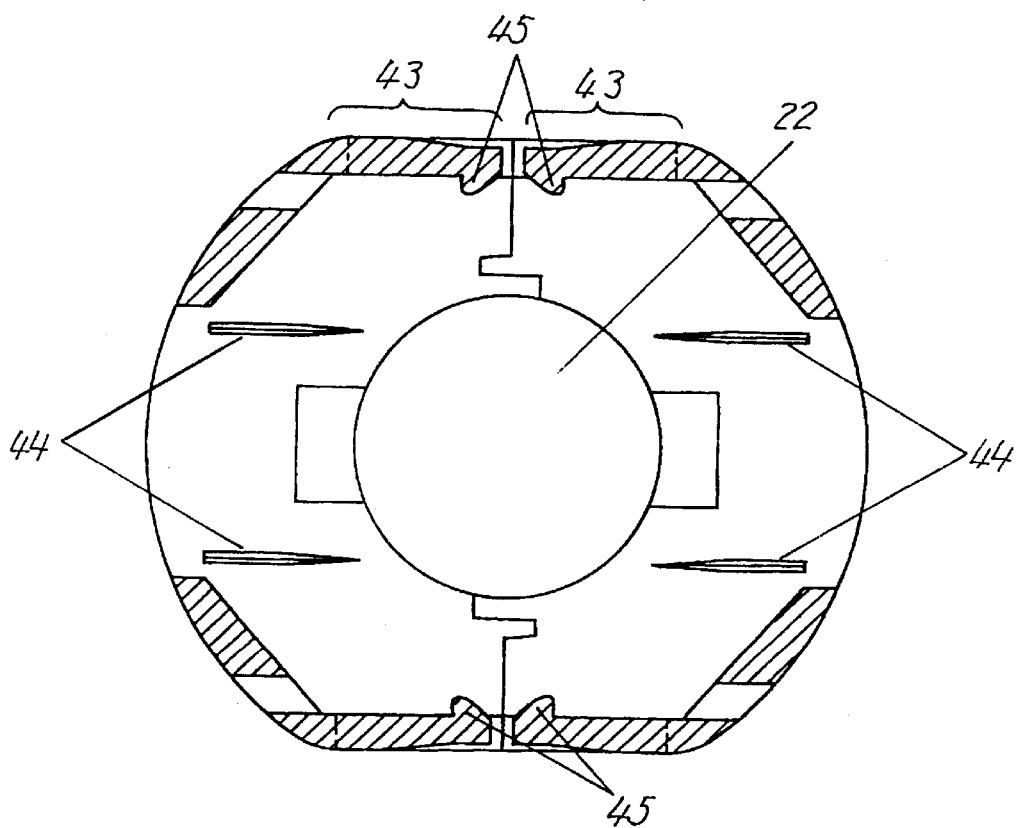

As shown in FIG. 13 and FIG. 14, the second noise elimination means makes respective magnetic flux A generated from the first coil 24 and magnetic flux B generated from the second coil 25 to proceed in a same direction within a central magnetic core 32 disposed in the bobbin 23; while they proceed in opposite directions to each other in the magnetic core 28, in a mode not offsetting to each other. Thus the second noise elimination means eliminates the normal mode noise 31. Meanwhile, the first noise elimination means eliminates the common mode noise by making the magnetic flux A and the magnetic flux B to proceed, as shown in FIG. 15 and FIG. 16, in a same direction in the magnetic core 28, in a mode not offsetting to each other.

The bobbin 23 is formed of two piece-members 33 of a bobbin, which had been split in a direction parallel to the through-hole 22 so as to be able to be recombined together at their split faces. Each of the piece-members 33 is provided with a middle flange 34 that separates the first coil 24 from the second coil 25. The middle flange 34 is provided with a hollow 35 that is open towards the inner surface of the piece-member 33. A central magnetic core 32 made of a magnetic material is disposed in the hollow 35, and the hollow 35 is provided with hooking means for hooking the central magnetic core 32.

As illustrated in FIG. 17 through FIG. 23, the piece-member 33 is provided at the bottom of the hollow 35 with a through-window 36 penetrating to the outer surface towards the counterpart feet 27 of magnetic core 28. The central magnetic core 32 has a protrusion 37 extruding through the through-window 36. A part of the central magnetic core 32 is exposed to the closed magnetic circuit core 28, in a manner not making contact. The protrusion 37 has a step 38 that makes contact to the bottom surface of the hollow 35. The inner ceiling surface 39 and the inner bottom surface 40 of hollow 35 are horizontal planes, and the upper surface 41 and the lower surface 42 of central magnetic core 32 are also forming horizontal planes in accordance with the inner ceiling surface 39 and the inner bottom surface 40 of hollow 35.

At both ends of the hollow 35 are hooking reeds 43 for hooking the central magnetic core 32, and a rib 44 is provided within the hollow 35 for elastically holding the central magnetic core 32. At the tip end of the hooking reed 43 is a hooking claw 45 for providing the central magnetic core 32 with a pressure effecting from the inner circumferential surface towards the outer circumferential surface of the piece-member 33. A slit 46 is provided at both sides of the hooking claw 45.

Each of the piece-members 33 is provided with a splitting flange 47 for splitting a coil. The splitting flange 47 is disposed so as there is a gap 48 between the end of splitting flange 47 and the split face of piece-member 33. Wire of a first coil 24, or a second coil 25, is transferred across the splitting flange 47 by way of the gap 48.

Figure 24:
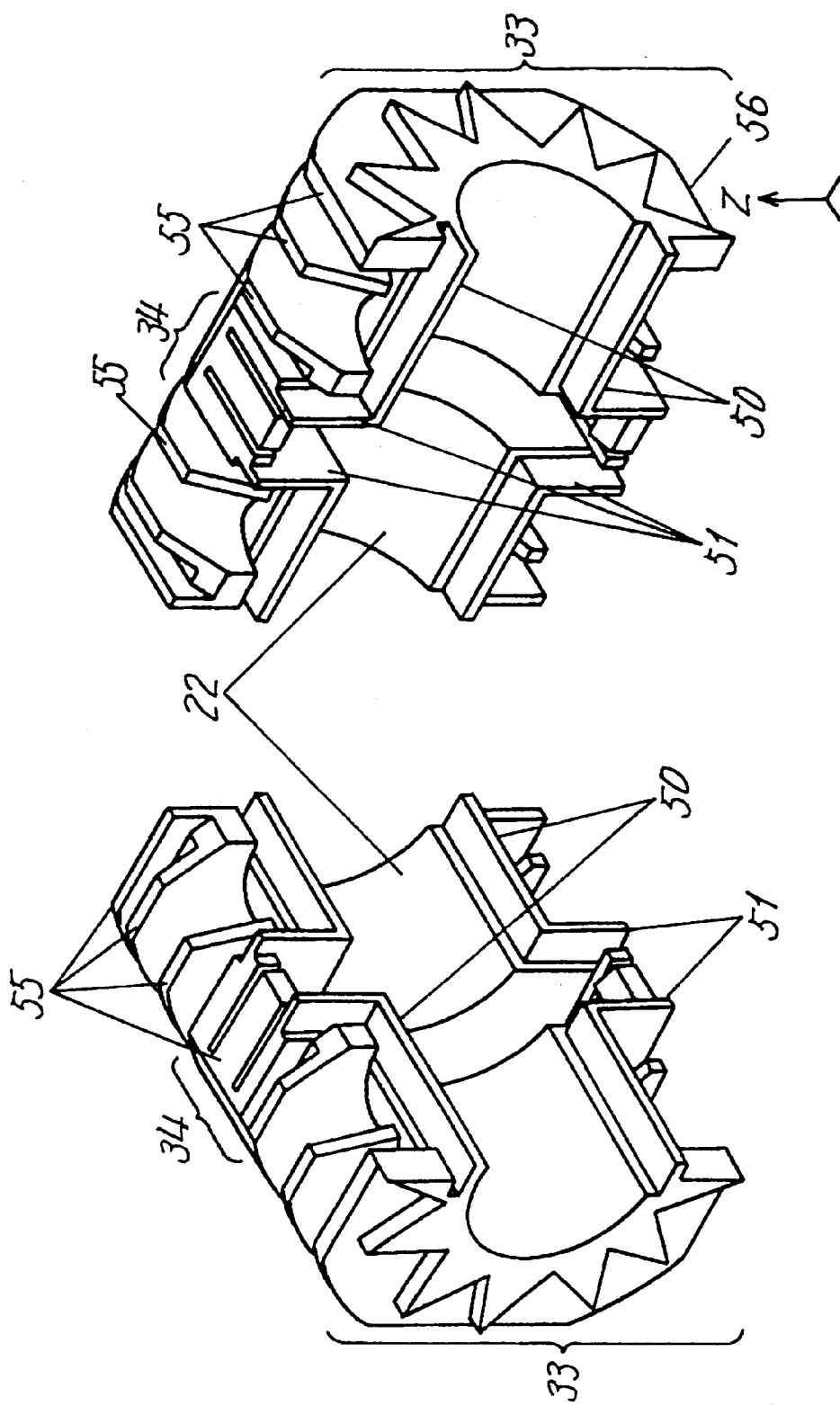
FIG. 24 is a magnified perspective view of the two piece-members of a bobbin.

As shown in FIG. 24, the piece-members 33 are disposed with their split faces in the vertical (direction Z) direction. Each of the piece-members 33 has horizontal planes at the upper surface 55 and the bottom surface 56. The split surface is provided with means for aligning the piece-members 33 to a right positioning to each other. The aligning means is formed of a first protruding wall 50 provided in parallel with the through-hole 22 and a second protruding wall 51 provided perpendicular to the through-hole 22 on the split face of piece-member 33. The first protruding wall 50 is provided for at least two with the through-hole 22 in between; the protruding walls 50 of each piece-member 33 are overlaid and held with a pressure to each other's. The second protruding wall 51 is provided for at least two with the middle flange 34 in between; the protruding walls 51 of each piece-member 33 are overlaid and held with a pressure to each other's.

Figure 25:
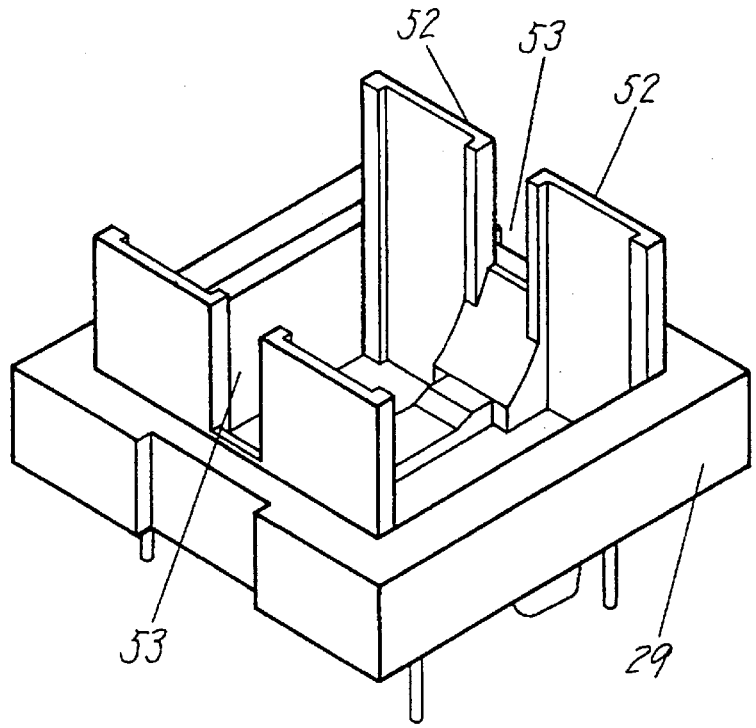
FIG. 25 is a perspective view of a terminal board of the line filter.
Figure 26:
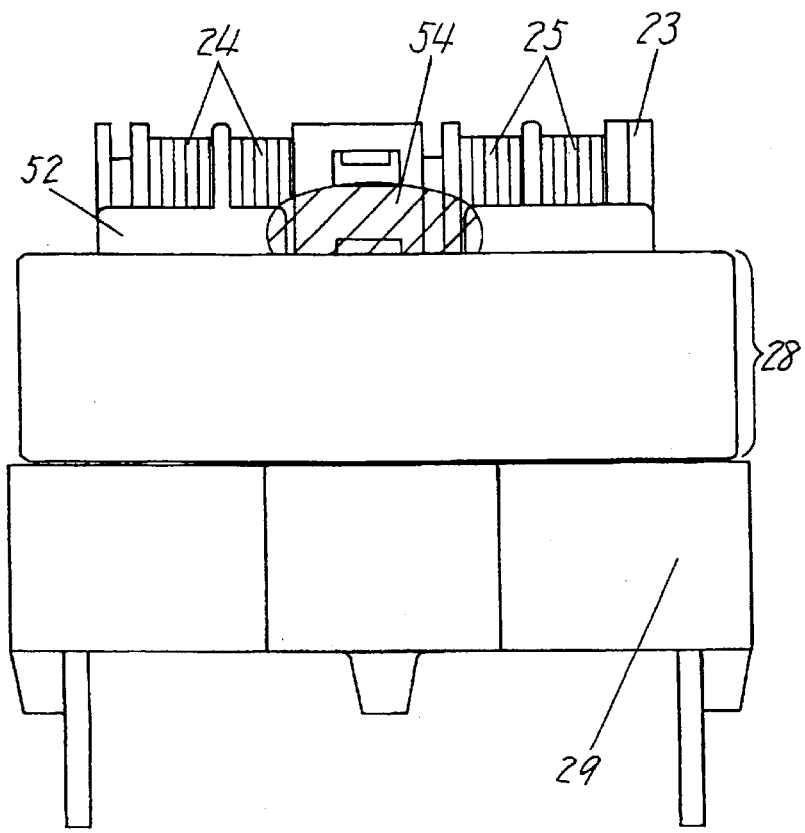
FIG. 26 is a front view of the line filter.

Next, as shown in FIG. 25 and FIG. 26, the terminal board 29 is provided with a terminal wall 52, which is arranged vertically to face the outer circumference of the bobbin 23. The terminal wall 52 has a cut 53 at a place corresponding to the middle flange 34 of bobbin 23. An adhesive agent is applied in the cut 53 for gluing the closed magnetic circuit core 28, the bobbin 23 and the terminal board 29 together. The outer dimensions in horizontal directions of the terminal board 29 are greater than those of the closed magnetic circuit core 28 in the horizontal directions.

With the above described structure, the common mode noise 30 is eliminated by the first noise elimination means. The normal mode noise 31 is eliminated by the second noise elimination means, where respective magnetic flux A generated from the first coil 24 and magnetic flux B generated from the second coil 25 are made to proceed in a same direction within the central magnetic core 32, while they proceed in opposite directions to each other in the closed magnetic circuit core 28 in a mode that the magnetic flux A and the magnetic flux B are not offsetting to each other. In this way, both of the common mode noise 30 and the normal mode noise 31 are eliminated altogether.

The central magnetic core 32 made of a magnetic material is disposed in the hollow 35 of the middle flange 26. The hollow 35 is open towards inside of the piece-member 33, and is provided with hooking means for hooking the central magnetic core 32; therefore, the central magnetic core 32 does not fall off the piece-member 33. Furthermore, because of the hooking means for hooking the central magnetic core 32 provided in the hollow 35, the central magnetic core 32 is fixed steady in the hollow 35, and the positioning of central magnetic core 32 relative to the hollow 35 can be precisely determined. Accordingly, the positioning of central magnetic core 32 relative to the closed magnetic circuit core 28 is also determined with a precision. Because of the above described structure, the elimination of normal mode noise 31 will not be affected adversely by a possible falling of the central magnetic core 32 off the piece-member 33, or by a possible contacting with the magnetic core 28.

The first coil 24 and the second coil 25 are wound around the bobbin 23 by rotating the bobbin 23 around the middle foot 26, after first disposing the central magnetic core 32 in the hollow 35, and then combining the piece-members 33 together. As the hollow 35 is open towards inside of the piece-member 33, the central magnetic core 32 is secured in place by a centrifugal force effected by the rotation for coil winding; so it does not fall off the piece-member 33 of bobbin. Furthermore, the central magnetic core 32 may not be dislocated within the hollow 35; therefore, a trouble such as making contact with the middle foot 26 will not arise, which trouble might sometimes cause a broken central magnetic core 32.

A part of the central magnetic core 28 is exposed through the through-window 36 provided in the bottom of the hollow 35 at a location facing to the counterpart feet 27 of the closed magnetic circuit core 28. This contributes to a reduction of the magnetic resistance between the central magnetic core 32 and the closed magnetic circuit core 28. This leads to an increased accuracy in eliminating the normal mode noise 31.

A protrusion 37 provided in the central magnetic core 32 makes a further contribution to a reduction of the magnetic resistance between the central magnetic core 32 and the closed magnetic circuit core 28, which provides a further improvement in the increased accuracy in the elimination of normal mode noise 31. In addition, because it is easy to adjust the protruding value of the protrusion 37, a distance between the central magnetic core 32 and the closed magnetic circuit core 28 can be easily determined for an optimum magnetic resistance.

The hooking means comprises a hooking reed 43 provided at both ends of the hollow 35 for hooking the central magnetic core 32. Therefore, the location of the central magnetic core 32 relative to the hollow 35 can be fixed precisely by the hooking means.

Accordingly, the positioning of central magnetic core 32 relative to the closed magnetic circuit core 28 is also determined precisely. Because of the above described structure, elimination of the normal mode noise 31 will not be ill affected by a possible falling of the central magnetic core 32 off the piece-member 33 of bobbin, or by a possible contacting with the magnetic core 28.

At the tip end of the hooking reed 43 is a hooking claw 45 that pushes the central magnetic core 32 from the inner circumferential surface towards the outer circumferential surface of the piece-member 33. Therefore, the central magnetic core 32 is fixed firm within the hollow 35 with the location relative to the hollow 35 precisely determined. As a rib 44 is provided within the hollow 35 for elastically holding the central magnetic core 32, the location of central magnetic core 32 relative to the hollow 35 can be determined at a higher precision level. Furthermore, the protrusion 37 is extruding from the through-window 36. This contributes to surely fix the central magnetic core 32. Thus the location of the central magnetic core 32 relative to the hollow 35 can be determined at a supreme precision level.

Because the hooking reed 43 is provided with a slit 46, the central magnetic core 32 is held with an elasticity when it is placed in the hollow 35 of the middle flange 34. Thus, the moderated pressure of hooking reed 43 prevents occurrence of a possible breakage on the central magnetic core 32.

The inner ceiling surface 39 and the inner bottom surface 40 of the hollow 35 have been finished to be horizontal planes, and the upper surface 41 and the lower surface 42 of the central magnetic core 32 are also finished to be horizontal planes in accordance with the inner ceiling surface 39 and the inner bottom surface 40 of the hollow 35. Therefore, the positioning of the central magnetic core 32 is regulated to a right direction within the hollow 35, and insertion of the central magnetic core 32 into the hollow 35 is easy.

Furthermore, as the central magnetic core 32 is provided with a step 38 and the step 38 is made to have contact to the bottom surface of the hollow 35, the positioning direction of the central magnetic core 32 within the hollow 35 is regulated a step more stringent.

Each of the piece-members 33 of bobbin has been disposed so as its split face is positioned vertical, and its upper surface 55 and lower surface 56 are made to from horizontal planes. This can be an advantage in a trial for reducing the overall height. Each of the split faces of the piece-members 33 is provided with position regulating means for regulating each other's positioning. Therefore, the piece-members 33 can easily be positioned to a right orientation in terms of relative location.

In the position regulating means, the respective first protruding walls 50 of the piece-members 33 are engaged overlaid together, and the second protruding walls 51 are also engaged overlaid together. Therefore, positioning between the couple of piece-members 33 is regulated in both vertical and horizontal directions. The above described structure also contributes to make the creeping distance in terms of electrical insulation longer; which offers an additional advantage in preventing occurrence of an insulation failure.

As each of the piece-members 33 is provided with at least two first protruding walls 50 and two second protruding walls 52 for engagement of corresponding walls with a pressure, the combined piece-members 33 are surely united to form a bobbin.

The winding of a coil 24, or a coil 25, may be shifted easily across the splitting flange 47 by making use of the gap 48 provided in the piece-members 33 of a bobbin.

Furthermore, the terminal wall 52 provided vertically on the terminal board 29 effectively insulates the first coil 24 and the second coil 25 from the closed magnetic circuit core 28. The closed magnetic circuit core 28, the bobbin 23 and the terminal board 29 can be glued together by applying an adhesive agent 54 in the cut 53 provided in the terminal wall 52. Thus, application of an adhesive agent 54 in one place completes the gluing operation; which makes a contribution in improving the productivity during manufacturing operation.

Because of the outer dimensions in horizontal directions of the terminal board 29 that are greater than those of the closed magnetic circuit core 28, the adjacent terminal boards 29 will come into contact with each other before the magnetic cores 28 get into mutual contact. The magnetic core 28 is thus protected against breakage.

Figure 27:
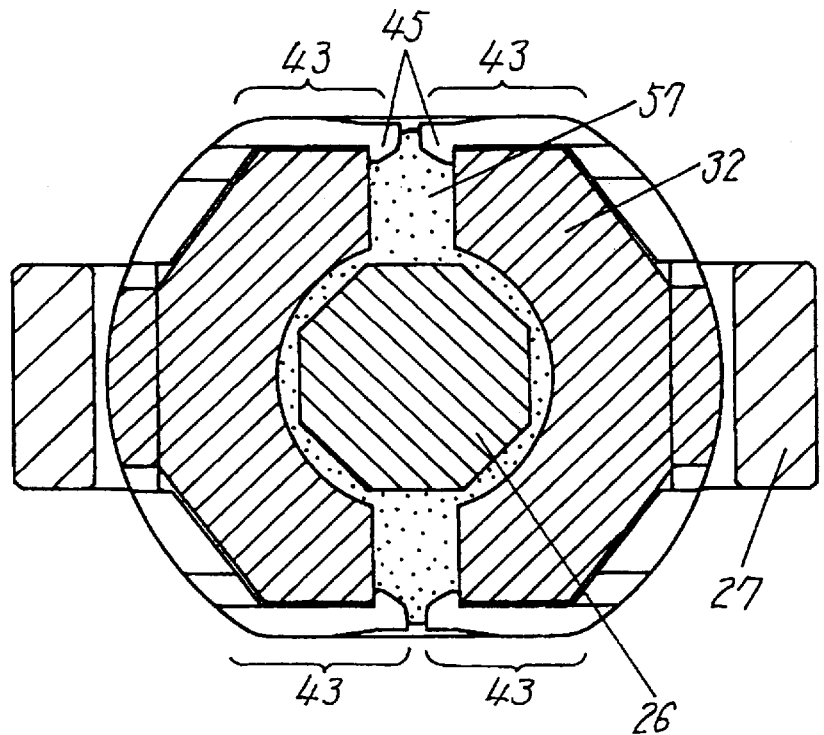
FIG. 27 is a cross sectional view of a bobbin with central magnetic core inserted therein, and filled with a magnetic resin.

In a line filter of the present second embodiment, the empty space within the through-hole 22 of bobbin 23 is not filled with anything. However, the space may be filled with a magnetic resin made of magnetic material, as shown in FIG. 27; providing a magnetic resin member 57, which occupies the empty space within the through-hole 22 and the hollow 35. The magnetic resin member 57 occupying the empty space within the through-hole 22 and the hollow 35 contributes to improve the magnetic characteristics, and to regulate the middle foot 26, the central magnetic core 32 and the bobbin 23 to a right positioning. It also contributes to suppress beating of the closed magnetic circuit core 28 and the central magnetic core 32.

Figure 28:
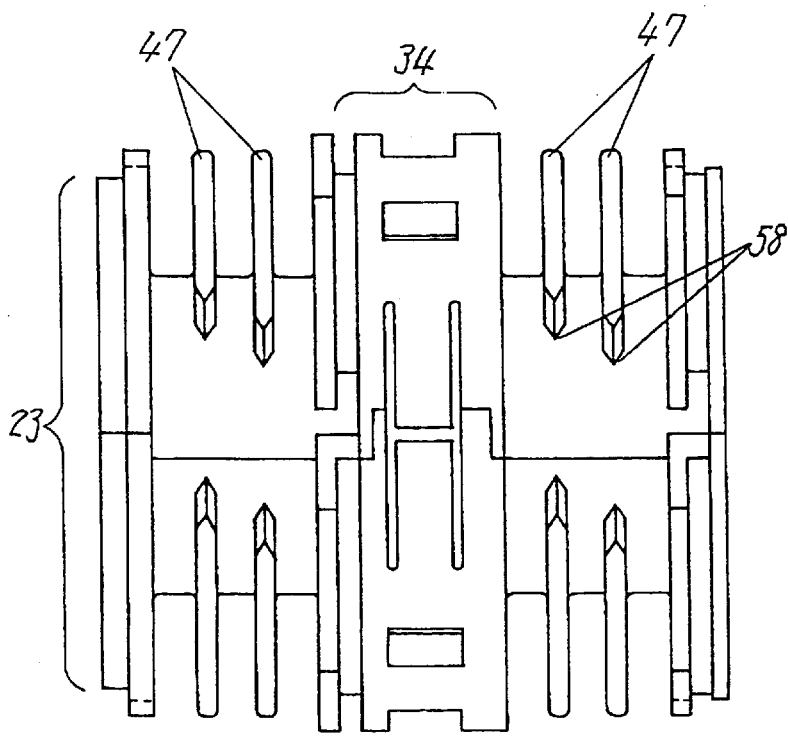
FIG. 28 shows a bobbin having a plurality of splitting flanges ready for the coil winding, as viewed from the top.
Figure 29:
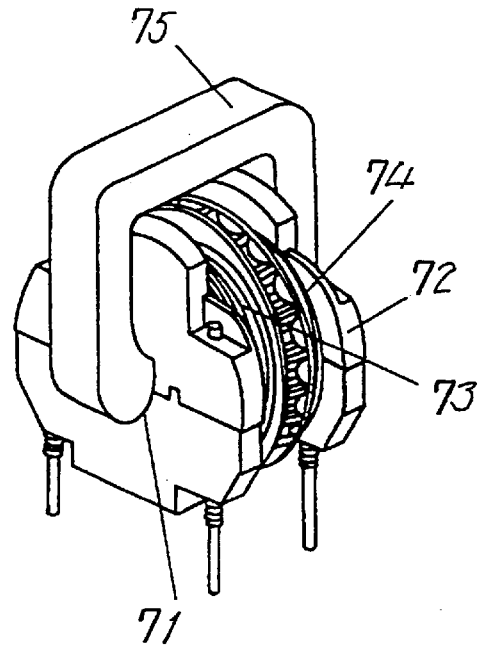
FIG. 29 is a perspective view of a conventional line filter.
Figure 30:
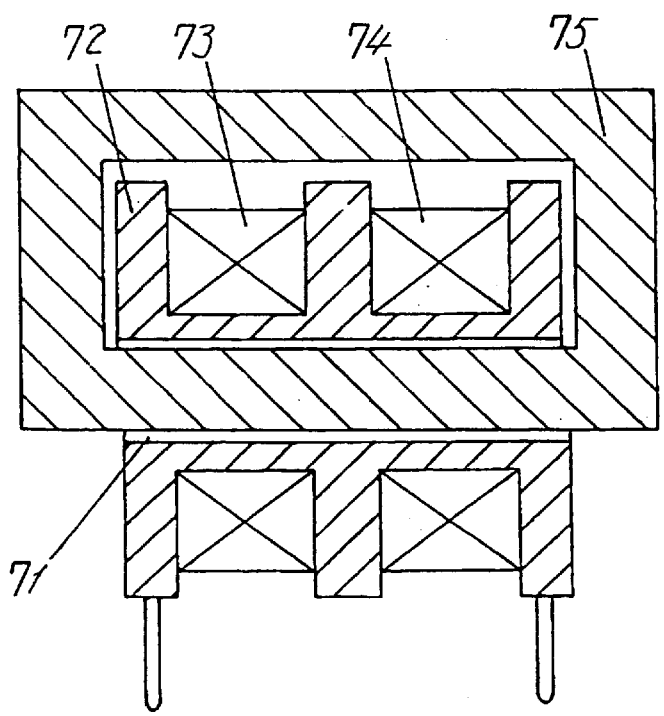
FIG. 30 is a cross sectional front view of the line filter.
Figure 31:
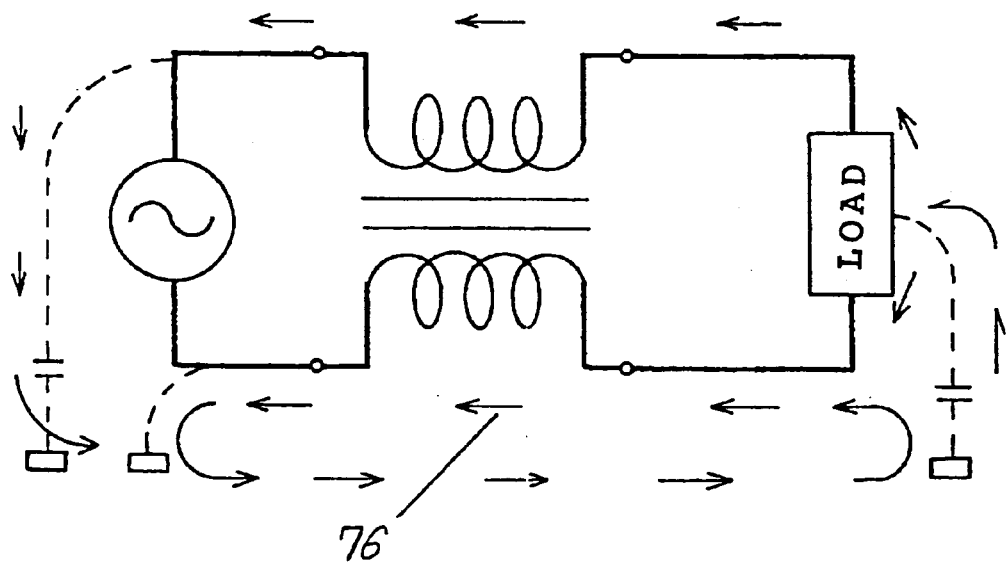
FIG. 31 is an electric circuit showing transmission of the common mode noise when the line filter is used.
Figure 32:
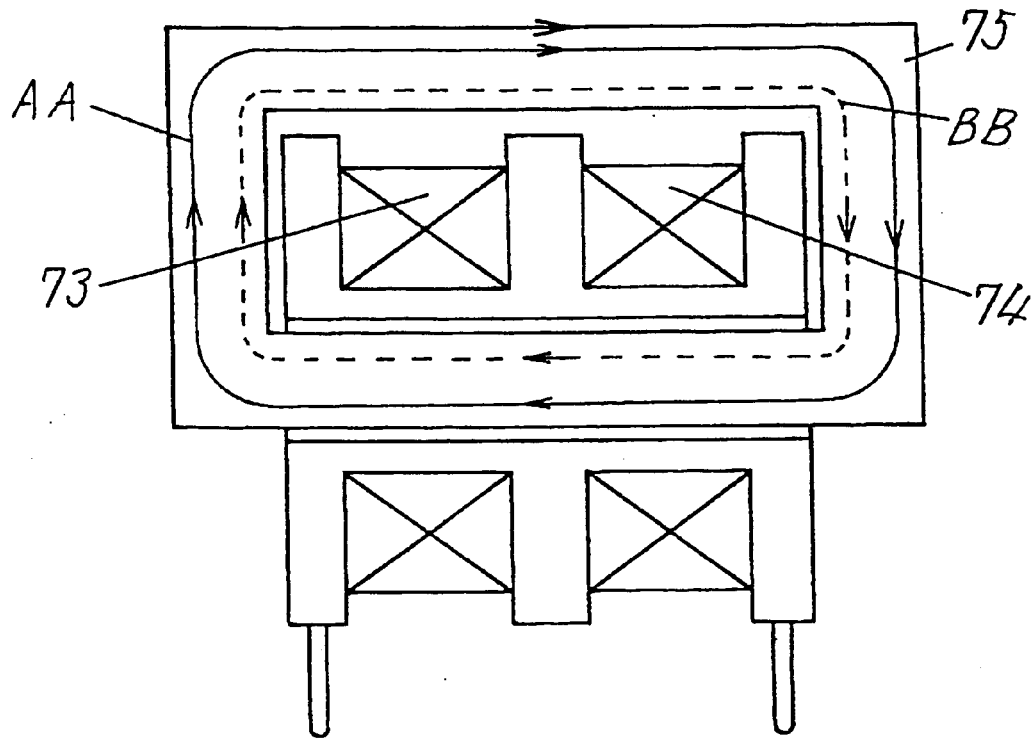
FIG. 32 illustrates a magnetic circuit showing flow of the magnetic flux due to common mode noise in the line filter.

Furthermore, a piece-member 33 may be provided with a plurality of splitting flanges 47, with the end locations 58 of adjacent splitting flanges 47 displaced one another in an oblique direction as illustrated in FIG. 28. If a winding of the first coil 24, or the second coil 25, is transferred from a span specified by the splitting flanges 47 to an adjacent span across the splitting flange 47 that has been disposed in the above described layout, the number of winding turns in a span will increase.

Although a closed magnetic circuit core 28 having a an EI joining cross-sectional shape has been used in the present second exemplary embodiment, a magnetic core having a rectangularly cylindrical shape may be used instead for yielding the same effect.

INDUSTRIAL APPLICABILITY

A line filter in accordance with the present invention is capable of eliminating both the common mode noise and the normal mode noise altogether. The central magnetic core will not fall off the piece-member of a bobbin, which central magnetic core is surely fixed in a hollow and its positioning and the direction within the hollow are precisely regulated.

As a result, the relative positioning between the central magnetic core and the closed magnetic circuit core are determined and maintained precisely. The occurrence of such troubles as falling of the central magnetic core off the piece-member, touching of the central magnetic core to the closed magnetic circuit core can be prevented. Thus, an adverse influence that could affect the elimination of normal mode noise is avoided. More in particular, during the winding operation of a first coil and a second coil around a bobbin, the central magnetic core is held firm in the piece-member under the effect of a centrifugal force generated by the rotation of bobbin; the central magnetic core would not fall off the piece-member, nor would it cause dislocation within the hollow during the rotation, such dislocation may be leading to a touching with, or even to a breakage of, the middle foot of closed magnetic circuit core.

Thus the present invention offers a line filter that has an improved characteristic in eliminating the normal mode noise, and is capable of eliminating both the common mode noise and the normal mode noise altogether.

What is claimed is:

1. A line filter comprising:
   a bobbin having a through-hole,
   a first coil and second coil wound around said bobbin, and
   a closed magnetic circuit core inserted through the through-hole of said bobbin, wherein
   said closed magnetic circuit core comprises a middle leg inserted in said through-hole and counterpart legs arranged outside of said bobbin encountering said middle leg;
   said bobbin is formed of piece-members which are two parallel pieces along a direction that is in parallel with the direction of said through-hole, the bobbin being formed by combining the piece-members at respective split faces, each of said piece-members having a middle flange for separating said first coil from said second coil, said middle flange comprising a hollow having an opening towards an inner surface of said piece-member, a central magnetic core made of magnetic material is provided in said hollow, and said hollow is provided with hooking means for hooking said central magnetic core.

2. The line filter of claim 1, wherein said middle flange is made of a magnetic material.

3. The line filter of claim 2, wherein the middle flange of the bobbin is adjacent to the closed magnetic circuit core.

4. The line filter of claim 2, wherein a smallest distance between the bobbin and the closed magnetic circuit core is not greater than a gap dimension between the inner wall-surface of the through-hole and the outer circumferential surface of said closed magnetic circuit core being inserted in said through-hole.

5. The line filter of claim 4, wherein the outer circumferential surface of the middle flange of bobbin is not making contact with the inner wall-surface of the closed magnetic circuit core.

6. The line filter of claim 1, wherein the hollow is provided with a through-window at the bottom penetrating to the outer surface of piece-member, said through-window locating at a place facing the counterpart feet of closed magnetic circuit core and a part of the central magnetic core being exposed through the through-window.

7. The line filter of claim 6, wherein the central magnetic core is provided with a protrusion protruding through the through-window.

8. The line filter of claim 1, wherein the hooking means is structured of a hooking reed provided at both ends of the hollow for hooking the central magnetic core.

9. The line filter of claim 8, wherein the hooking reed is provided at the tip end with a hooking claw for pushing the central magnetic core from the inner surface towards the outer surface of piece-member of a bobbin.

10. The line filter of claim 8, wherein the hooking reed is provided with a slit.

11. The line filter of claim 8, wherein the inner ceiling surface and the inner bottom surface of the hollow are horizontal planes, and the upper surface and the lower surface of the central magnetic core are horizontal planes in correspondence with said inner ceiling surface and the inner bottom surface of the hollow.

12. The line filter of claim 1, wherein the hooking means is structured of a rib provided within the hollow for holding the central magnetic core with a pressure.

13. The line filter of claim 12, wherein the inner ceiling surface and the inner bottom surface of the hollow are horizontal planes, and the upper surface and the lower surface of the central magnetic core are horizontal planes in correspondence with said inner ceiling surface and the inner bottom surface of the hollow.

14. The line filter of claim 1, wherein the hooking means is structured of a through-window provided at the bottom of the hollow penetrating to the outer surface of piece-member of a bobbin and a protrusion of the central magnetic core protruding through said through-window.

15. The line filter of claim 14, wherein the protrusion is provided with a step that makes contact to the bottom of the hollow.

16. The line filter of claim 14, wherein the inner ceiling surface and the inner bottom surface of the hollow are horizontal planes, and the upper surface and the lower surface of the central magnetic core are horizontal planes in correspondence with said inner ceiling surface and the inner bottom surface of the hollow.

17. The line filter of claim 1, wherein the piece-member of a bobbin is disposed so as the split face is in the vertical direction and said piece-member is provided with a horizontal plane at the upper and the lower surfaces.

18. The line filter of claim 1, wherein the piece-member of a bobbin is provided at the split face with alignment means for aligning the piece-members to a right relative positioning to each other.

19. The line filter of claim 18, wherein the alignment means for aligning to a right relative positioning is structured of a first protruding wall provided in a direction parallel with the through-hole and a second protruding wall provided perpendicular to the through-hole on the respective split faces of piece-members, respective walls of said first protruding wall in said piece-members of a bobbin being overlaid together and respective walls of said second protruding wall in said piece-members of a bobbin being overlaid together.

20. The line filter of claim 19, wherein the first protruding wall is provided for at least two with the through-hole in between, respective walls of said first protruding wall in piece-members of a bobbin being overlaid and held to each other with a pressure, while the second protruding wall is provided for at least two with the middle flange in between, respective walls of said second protruding wall in piece-members of a bobbin being overlaid and held to each other with a pressure.

21. The line filter of claim 1, wherein the piece-member of a bobbin is provided with a plurality of splitting flanges for splitting a coil, the splitting flange being disposed so as there is a gap between the end of said splitting flange and the split face of said piece-member enabling a winding of a coil in a span specified by said splitting flanges to be transferred to an adjacent span through said gap.

22. The line filter of claim 20, wherein the splitting flanges are disposed so as the ends of adjacent splitting flanges are dislocated one after another in an oblique direction.

23. The line filter of claim 1, further comprising a terminal board for holding said closed magnetic circuit core horizontally, said terminal board having a terminal wall standing vertically between said bobbin and said closed magnetic circuit core, facing to the outer surface of said first coil and second coil, said terminal wall being provided with a cut at a place corresponding to the middle flange housing the central magnetic core; and said closed magnetic circuit core, said bobbin and said terminal board are glued together by an adhesive agent applied in the cut.

24. The line filter of claim 23, wherein the middle flange is provided with a through-window penetrating to the outer surface of piece-member of a bobbin, said through-window locating at a place facing the counterpart feet of closed magnetic circuit core so as a part of the central magnetic core is exposed; and said closed magnetic circuit core, said bobbin, said terminal board and said central magnetic core are glued together by an adhesive agent applied in the cut.

25. The line filter of claim 1, wherein a magnetic resin member is provided by filling empty spaces in the through-hole and the hollow of a bobbin with a magnetic resin.

26. The line filter of claim 1, wherein the central magnetic core and the closed magnetic circuit core are not making contact with each other.

27. The line filter of claim 1 further comprising a terminal board for holding said closed magnetic circuit core horizontally, wherein the outer dimensions of said terminal board are greater than those of said closed magnetic circuit core.

* * * * *

UNITED STATES PATENT AND TRADEMARK OFFICE
CERTIFICATE OF CORRECTION

| | |
|---|---|
| PATENT NO. : 6,078,242 | Page 1 of 1 |
| DATED : June 20, 2000 | |
| INVENTOR(S) : Tomita et al. | |

It is certified that error appears in the above-identified patent and that said Letters Patent is hereby corrected as shown below:

Column 11,
Line 8, "20" should read -- 21 --.

Signed and Sealed this

Twenty-eighth Day of August, 2001

*Attest:*

NICHOLAS P. GODICI
*Attesting Officer      Acting Director of the United States Patent and Trademark Office*